United States Patent [19]

Ludeke

[11] Patent Number: 5,095,270
[45] Date of Patent: Mar. 10, 1992

[54] METHOD OF SUPPRESSING CURRENT DISTRIBUTION NOISE IN A DC SQUID

[75] Inventor: Kai-Michael Ludeke, Hamburg, Fed. Rep. of Germany

[73] Assignee: U.S. Philips Corporation, New York, N.Y.

[21] Appl. No.: 565,825

[22] Filed: Aug. 10, 1990

[30] Foreign Application Priority Data

Aug. 16, 1989 [DE] Fed. Rep. of Germany ....... 3926917

[51] Int. Cl.$^5$ .............................................. G01R 33/035
[52] U.S. Cl. ..................................... 324/248; 505/846
[58] Field of Search ................. 324/248; 505/842, 843, 505/845, 846, 702

[56] References Cited

U.S. PATENT DOCUMENTS

| | | | |
|---|---|---|---|
| 3,725,819 | 4/1973 | Fulton | 324/248 X |
| 4,389,612 | 6/1983 | Simmonds et al. | 324/248 |
| 4,585,999 | 4/1986 | Hilbert et al. | 324/248 X |
| 4,663,590 | 5/1987 | Gershenson et al. | 324/248 |
| 4,689,559 | 8/1987 | Hastings et al. | 324/248 |

FOREIGN PATENT DOCUMENTS 0053625 9/1987 European Pat. Off. .

OTHER PUBLICATIONS

J. Clarke, "Principles and Applications of SQUIDS", Proceedings of the IEEE, vol. 77, No. 8, Aug. 1989, pp. 1208-1223.
S. Kuriki, M. Matsuda, & A. Matachi, "Effects of Alernating Bias Current On The Low-Frequency Noise in DC SQUIDS", Journal of Applied Physics, vol. 64, Jul. 1, 1988, pp. 239-241.
V. Foglietti, W. J. Gallagher, & R. H. Koch, "A Novel Modulation Technique For 1/f Noise Reduction in DC SQUIDS", IEEE Transactions on Magnetics, vol. MA-G-23, No. 2, Mar. 1987, pp. 1150-1153.
O. V. Snigirev, "Ultimate Sensitivity of the DC SQUIDS Using Unshunted Josephson Tunnel Junctions," IEEE Transactions on Magnetics, vol. MAG 19, No. 3, May 1983, pp. 584-586.
Gutmann, P., "Two Junction SQUID Using A Sampling Technique", Eds. Hahlbohm, Lubbig, 1977, pp. 501-509.

Primary Examiner—Kenneth A. Wieder
Assistant Examiner—Warren S. Edmonds
Attorney, Agent, or Firm—William Squire

[57] ABSTRACT

A method of suppressing current distribution noise in a DC SQUID comprising two Josephson junctions (12) in a superconducting current. This current distribution noise is caused by individual fluctuations of the critical currents of the two Josephson junctions used for measuring weak magnetic fields. A DC SQUID is connected to a device which comprises a control device (14) for generating a periodic bias current ($I_b$), a modulation device (15) for generating a flux modulation via an induced AC current in the loop (11), and a signal detection device (17) for forming a mean output voltage ($V_{ges}$). The polarity of the bias current ($I_B$) is reversed by the control device (14) with the modulation frequency and a time shift of one quarter of the period duration of the modulation frequency, so that the SQUID assumes different bias states. In the case of suitably weighted signal detection in the signal detection device (17), the current distribution noise signals stemming from fluctuations of the critical currents eliminate one another in the signal sum taken over four bias states.

18 Claims, 1 Drawing Sheet

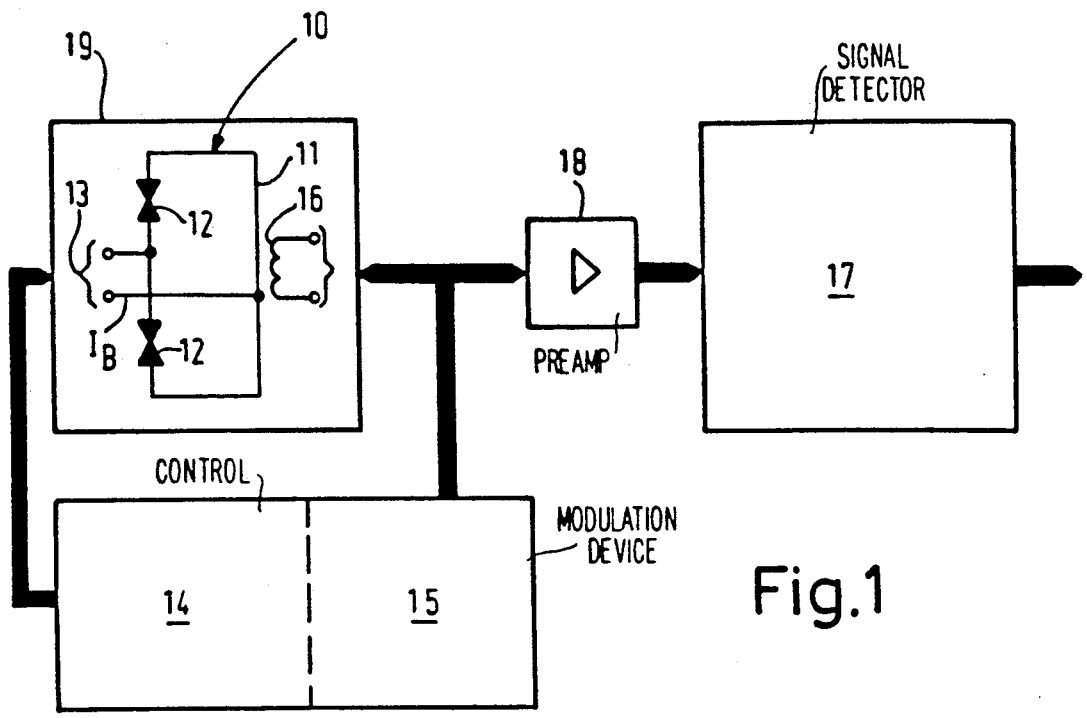
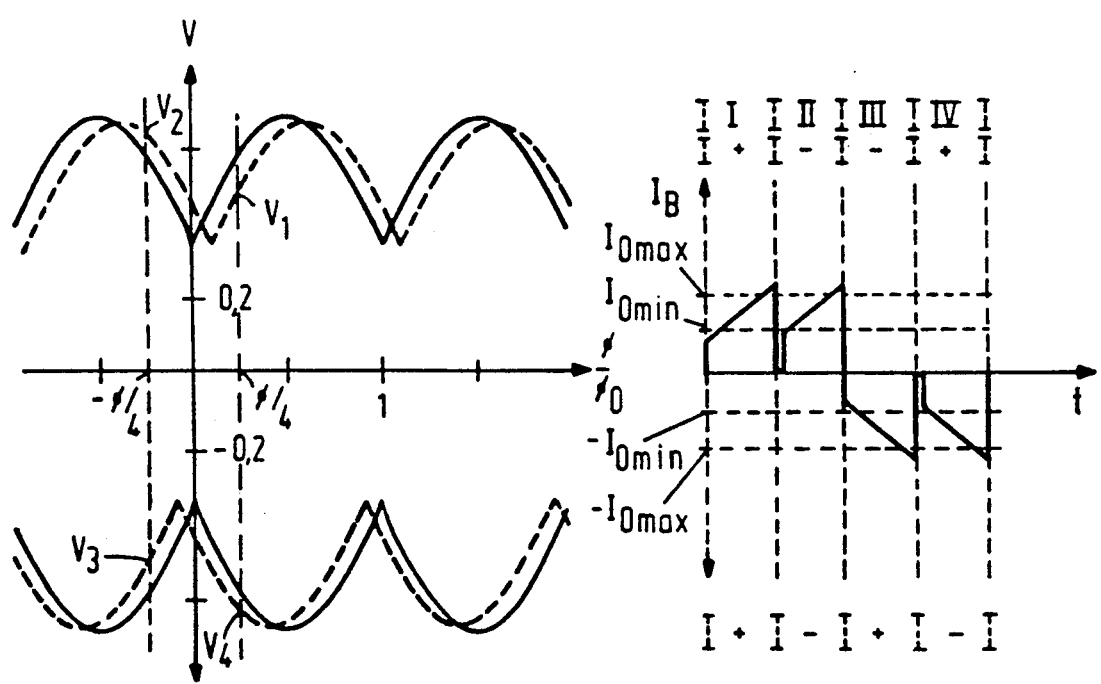
Fig.1
Fig.2    Fig.3

METHOD OF SUPPRESSING CURRENT DISTRIBUTION NOISE IN A DC SQUID

BACKGROUND OF THE INVENTION

The invention relates to a method of suppressing current distribution noise in a DC SQUID which comprises two Josephson junctions in a superconducting loop and which is connected to a device which comprises a control device for generating a periodic bias current, a modulation device for generating a flux modulation over an induced AC current in the loop, and a signal detection device for forming a mean output voltage.

DESCRIPTION OF THE PRIOR ART

For the measurement of weak magnetic fields in a range below $10^{-10}$ Tesla use is made of superconducting quantum interference elements which are known as SQUIDs (Superconducting Quantum Interference Devices) and which serve, for example for the measurement of the magnetic fields in magnetocardiography, magnetoencephalography, or also for liver susceptometry. Such measuring devices comprise, in addition to the SQUID, a gradiometer, a coupling-in coil and a modulation coil within a cryogenic system for the low-temperature range in order to achieve superconductivity. The modulation coil is connected to a modulation or control device which itself is connected to the SQUID. The modulation device is connected to an evaluation or signal detection device. The SQUID consists of a closed superconducting loop which is interrupted by two Josephson junctions. A non-superconducting DC terminal is provided between the junctions. The voltage between the terminals varies in dependence on the coupled-in magnetic field, in as far as no opposed magnetic field is generated as an indicator by way of the modulation coil (flux-locked loop modulation method). The Josephson junctions of such SQUIDs have only very small contact faces in order to achieve a high sensitivity. Due to the alternating trapping and liberation of electrons in the insulating barrier of these Josephson junctions, the potential threshold of the barrier, and hence also its critical current, fluctuates in time, causing a current distribution noise in the SQUID with an 1/f-like frequency behavior. In the case of Josephson junctions comprising extremely small faces, thermodynamically induced fluctuations of the critical currents, also occur.

Methods and/or circuit arrangements dealing with this problem are known. For example, European Patent 0 053 625 discloses a circuit arrangement comprising a DC SQUID which comprises Josephson junctions in a superconducting loop and also a control device for applying a bias current across the junctions, the control device being constructed so that the polarity of the bias current is reversed with a first frequency. In order to generate an induced modulation AC current in the loop there are provided modulation means for modulation with a given second frequency which deviates from the first frequency. There are also provided means for generating an output signal and a demodulator which receives this output signal in order to combine it with a signal having the second frequency, resulting in a demodulated output signal. In this circuit arrangement as well as in the method which is known from Kuriki, Matsuda, Matatchi "Effects of alternating bias current on the low-frequency noise in dc SQUIDs", J. Appl. Phys. 64 (1), July 1, 1988, pp. 239–241, a flux modulation and a bias current are modulated with different frequencies. In accordance with the cited European Patent Specification, this takes place, for example with a flux/current frequency ratio of 1:4; according to Kuriki et al it is 8:1 and in a further known bio-magnetometer the ratio is 1:4.5. Therein, the generating of the modulation and demodulation signals is particularly intricate. It is also a drawback that the useful signal is distributed over a wide spectrum of combination frequencies. Because the lower one of the two modulation frequencies must be selected to exceed the desired signal bandwidth, the higher one of the two modulation frequencies and the higher combination frequencies also to be processed determine the required bandwidth of the signal detection device. The input section of the signal detection device comprises a step-up coupling transformer and a low-noise field effect transistor as the first amplifying element. Because the input capacitance of the amplifier and the leakage inductance of the transformer determine the upper limit frequency of the signal path, the transformation ratio of the transformer cannot be chosen to be as high as would be desirable to achieve a sufficiently low noise contribution by the preamplifier.

From Fogglietti, Gallagher, Koch "A novel modulation technique for 1/f noise reduction in dc SQUIDs", IEEE MAG 23, No. 2, 1987, pp. 1150–1153 a method is known where the SQUID successively assume four bias states, the states 2 and 4 thereof being inactive. Due to the two inactive bias states, in comparison with the standard flux-locked loop method a loss occurs in the transfer function (flux into voltage) in the Fourier series expansion of the signal voltage on the useful signal frequencies, so that a noise reduction that can be achieved in the range of the 1/f noise is accompanied by a deterioration of the spacing between signal power and noise power by a factor 2 in the range of the white noise in comparison with the standard flux-locked loop method.

Non-hysteretic DC SQUIDs comprise integrated parallel resistances and operate either with a constant bias current (standard flux-locked loop method) or with a bias current whose polarity is periodically reversed in accordance with the above method.

In hysteretic DC SQUIDs comprising Josephson tunnel junctions without integrated parallel resistances, a periodic following of the hysteresis curve can be imposed by operation using a sawtooth current function as known from P. Gutmann "Two-junction SQUID using a sampling technique, in SQUIDs and their applications", Eds.: Hahlbohm, Lübbig, 1977, pp. 501–509, and O. V. Snigirev "Ultimate sensitivity of the dc SQUIDs using unshunted Josephson-Tunnel junctions", IEEE MAG-19, No. 3, May 1983, pp. 584–586. For each cycle the flux-dependent critical current is converted into a pulse duty factor modulated output voltage which can subsequently be measured. Even though the conversion factor (flux into voltage) is already higher and hence better than in noise-optimized, non-hysteretic DC SQUIDs, this method still involves substantial undesirable current distribution noise.

SUMMARY OF THE INVENTION

It is an object of the present invention to provide a method which not only is implemented with a simple construction but is also capable of suppressing the noise occurring in DC SQUIDs due to individual fluctuations of the critical currents, of the two Josephson junctions.

This object is achieved in accordance with the invention in that a control device reverses the polarity of the bias current with the modulation frequency of the flux and a time shift amounting to one quarter of the period duration of the modulation frequency, so that the SQUID assumes different bias states, and that the signal detection device performs a weighting operation for each bias state, taking into account the sign, the sum of several output voltages thus weighted being a mean output voltage which is proportional to the measuring quantity only.

The method in accordance with the invention utilizes the standard flux-locked loop method where, using a coil, a flux modulation is performed, using a coil, about the quasi-static flux operating point by a quarter of the flux quantum $\phi \approx 2.10^{-15} W_b$ and additionally the polarity of the bias current is periodically reversed with the same frequency but with a time shift amounting to one quarter of the period duration of the modulation frequency. As a result of this step, executed by a modulation and control device, the SQUID successively assumes preferably four bias states. In a subsequent signal detection device, the mean output voltage is then formed from the sum of the four sign-weighted output voltages, each of the four output voltages being formed from an respective voltage of a operating point, defined by the time shifted bias current, and their derivatives according to the flux $\phi$ in the relevant operating point.

The individual terms of the of the mean output voltage are formed from a sum of four terms in accordance with the invention. One of the terms represents the corresponding voltage in the corresponding operating point. Two further terms represent the mean critical current and the measuring quantity. Via the fourth term, any asymmetry of the SQUIDs is taken into account. On the basis of the bias current it is achieved in accordance with the invention that the negative voltage $V_3$ at the operating point 3 has the same magnitude as the positive voltage $V_1$ at the operating point 1 and that the negative voltage $V_4$ at the operating point 4 has the same magnitude as the positive voltage $V_2$ at the operating point 2. On the basis of the bias current it is achieved in accordance with the invention that the voltage at the working point 3 corresponds to the negative voltage at the working point 1 and that the voltage at the working point 4 corresponds to the negative voltage at the working point 2. In the case of a symmetrical SQUID, a simplification can be realized in that the voltage at the operating point 2 corresponds to that at the operating point 1 and the sum of their partial derivatives according to the flux $\phi$ produces zero.

In the signal detection device the signal detection is preferably performed, for example by means of a synchronous detector (locked-in detector) with double the frequency, an alternating weighting operation then being performed which changes its sign for each bias state. The current distribution noise signals thus add to zero.

In accordance with the invention the signal detection device alternatively may perform signal detection on the modulation frequency with a successively pair-wise equal weighting sequence (+ + − −). The mean output voltage thus determined can be used for the automatic balancing (last occurrence) a bridge circuit to compensate the mean value of mean output voltage prior to, for example, a subsequent signal amplifier.

The signal detection device can also perform a signal detection on the modulation frequency in quadrature phase with a symmetrical weighting sequence (+ − − +).

In the case of a symmetrical SQUID, simplifications occur each time in the determination of the mean output voltage.

In comparison with the cited circuit arrangement disclosed in European Patent Specification 0 053 625 and the method according to Kuriki et al, where the flux and the bias current are modulated with different frequencies, the generating of the modulation and demodulation signals in accordance with the invention is simplified. In comparison, with a method employing half-integer frequency ratio, furthermore, it is advantageous that no combination frequencies below the modulation frequency occur in the signal spectrum.

Furthermore, for a comparable signal bandwidth, the proposed quadrature modulation method with detection at double the frequency in accordance with the invention enables a reduction of the bandwidth prior to detection, notably of the upper limit frequency of the signal path from the SQUID to the demodulator, with respect to the known method, which reduction can be used directly for reducing the noise contribution from an input amplifier. This is because it enables the use of field effect transistors having a lower noise voltage and a higher input capacitance in the preamplifier as well as the use of coupling transformers having a higher transformation ratio and a higher leakage inductance and leakage capacitance between the SQUID and the preamplifier. The higher transformation ratio reduces the contribution by the preamplifier to the overall noise. The reduction of the upper limit frequency, introduced by the increased leakage inductance and input capacitance, is not problematic in the method in accordance with the invention.

In comparison with the described method according to Foglietti et al, only active bias states occur in the method in accordance with the invention, so that deterioration of the signal-to-noise ratio in the white noise range is avoided.

The method in accordance with the invention can also be used for hysteretic DC SQUIDs comprising Josephson junctions without integrated parallel resistances. Non-hysteretic DC SQUIDs comprising integrated parallel resistances operate either with a constant bias current or with a bias current whose polarity is periodically reversed. For hysteretic DC SQUIDs it is possible, through operation with a sawtooth-shaped bias current, to enforce a periodic following of the hysteresis curve consisting of the superconducting characteristic and the tunnel characteristic of the electrons (the so-called quasi-particles), as is known from the cited sources Gutmann and Snigirev.

According to this method for hysteretic DC SQUIDs, the control device controls the bias current so that, in an absolute sense and within a bias state, it increases from a current below a smallest critical current linearly to a current above a largest critical current and is subsequently briefly switched off in order to bring the SQUID to the no-voltage state again. In order to suppress the current distribution noise also for these methods for hysteretic DC SQUIDs, in accordance with the invention the sign of the bias current is changed after each time two bias states, the flux modulation taking place in units of $\phi/4$ in the four states with the weighting sequence + − − +. As a result, for each bias state the flux-dependent critical current is converted into a pulse duty factor modulated output voltage which can be detected by means of known measuring methods.

It is to be noted that the signal detection device may advantageously be preceded by a preamplifier as has already been mentioned.

IN THE DRAWING

An embodiment in accordance with the invention will be described in detail hereinafter with reference to a drawing. Therein:

FIG. 1 is a diagrammatic representation of a device for performing the method in accordance with the invention, FIG. 2 shows a voltage variation in a symmetrical and an asymmetrical DC SQUID, in dependence on a flux $\phi$ and operating points defined by way of example via a bias current, and FIG. 3 shows a sawtooth bias current for a hysteretic DC SQUID.

DESCRIPTION OF THE PREFERRED EMBODIMENT

FIG. 1 diagrammatically shows the components of a device for performing the method in accordance with the invention which are necessary for influencing and detection of a SQUID. A gradiometer (not shown) and a coupling-in coil which form a closed superconducting current loop, detect the magnetic field to be measured and transform it in a DC SQUID 10 (shown in simplified form) which consists of a superconducting loop 11 and two series-connected Josephson junctions 12. Between the Josephson junctions 12 there is provided a non-superconducting DC terminal 13. The DC terminal 13 is connected to a bias current gene control device 14 which applies the bias current to terminal 13 and which itself is connected to a modulation device 15 which acts on a modulation coil 16 for generating a flux modulation via an induced AC current in the loop 11 of the SQUID 10 and which is also connected, via a preamplifier 18, to a signal detection device 17 for the detection and combination of the signals from the SQUID 10. The signal detection device 17 may furthermore be succeeded by a signal amplifier (not shown). The contour 19 indicates which parts of the device are accommodated in a cryogenic system in order to achieve the low-temperature range necessary for creating the superconductivity. The gradiometer (not shown) and the coupling-in coil are also situated within the cryo system 19. Further components of the device, for example for generating and further processing of the signals, are known from the state of the art and are not shown.

FIG. 2 shows the voltage/flux variation for a positive and a negative bias current at terminal 13; the representation is in broken lines for an asymmetrical DC SQUID and in non-interrupted line for a symmetrical DC SQUID.

If, additional to the flux modulation with approximately $\pm\phi_0/4$ used in the standard flux-locked loop method, where $\phi_0$ is a quantized unit of flux $\phi$, in accordance with the invention the bias current $I_B$ is periodically reversed with the same frequency but with a time shift of one quarter of the period duration of the modulated flux $\phi$, an asymmetrical DC SQUID follows the broken curve and a symmetrical DC SQUID follows the non-interrupted curve. For the general case, i.e. an asymmetrical SQUID, the voltages $V_1$, $V_2$, $V_3$, $V_4$ at terminal 13 are shown for the corresponding operating points, which voltages exhibit a time shift of one quarter of the period duration of the modulated flux $\phi$. The SQUID successively assumes four bias states, for example in a sequence $(+--+)$ for the bias flux in units of approximately $\phi_0/4$ for a polarity $(++--)$ of the bias current $I_B$. In the signal detection device 17 a weighting operation is performed which changes its sign for each state, so that in the signal, the sum of the four states of the current distribution noise signals resulting from the fluctuations of the critical currents eliminate one another. The signal detection can then be performed, for example by a synchronous detector (lock-in detector) with double the modulation frequency. For a measured flux quantity $\delta\phi(t)$, a mean critical current 1) $I_o+\delta I_o(t)=(I_{o1}(t)+I_{o2}(t))/2$, where $\delta I_o(t)$ represents bias current fluctuation due to noise an asymmetry 2) $\alpha+\delta\alpha(t)=(I_{o1}(t)-I_{o2}(t))/(I_{o1}(t)+I_{o2}(t))$, and voltages at the operating point 3) $V_3=-V_1$, $V_4=-V_2$, there is obtained at the output of detector 17 a mean output voltage 4) $V_{ges}=V_{o1}-V_{o2}+V_{o3}-V_{o4}$, where $V_{oi}$ represents an output voltage.

For

5) $\quad V_{o1}=V_1+\partial V_1/I_o\partial I_o(t)+\partial V_1/\partial\alpha\delta\alpha(t)+\partial V_1/\partial\phi\delta\phi(t);$ 6) $\quad V_{o2}=V_2+\partial V_2/\partial I_o\delta I_o(t)+\partial V_2/\partial\alpha\delta\alpha(t)+\partial V_2/\partial\phi\delta\phi(t);$ 7) $\quad V_{o3}=-V_1-\partial V_1/\partial I_o\delta I_o(t)-\partial V_1/\partial\alpha\delta\alpha(t)+\partial V_1/\partial\phi\delta\phi(t)$, and 8) $\quad V_{o4}=-V_2-\partial V_2/\partial I_o\delta I_o(t)-\partial V_2/\partial\alpha\delta\alpha(t)+\partial V_2/\partial\phi\delta\phi(t)$, where $\delta\alpha(t)$ represents bias current distribution fluctuation due to noise, there is obtained a mean output voltage 9) $V_{ges}=2(\partial V_1/\partial\phi-\partial V_2/\partial\phi)\delta\phi(t)$ which is proportional only to the measured quantity $\delta\phi(t)$. Therein, $\partial V_1/\partial\phi>0$, $\partial V_2/\partial\phi<0$, so that for the expression between parentheses, the overall is positive. The signs of the voltages $V_1$, $V_2$ and their partial derivatives at the relevant operating point and the equality in an absolute sense of the working points in the states 1, 3 and 2, 4 used here results from the symmetry properties of the characteristic shown in FIG. 2. Additionally, for symmetrical SQUIDs it holds good that, as appears from FIG. 2:

$V_2=V_1$, $\partial V_2/\partial\phi=-\partial V_1/\partial\phi$.

In the case of signal detection at the modulation frequency with a different weighting sequence, i.e. $(++--)$, $V_{ges}=V_{o1}+V_{o2}-V_{o3}-V_{o4}=2*(V_1+V_2+(\partial V_1/\partial I_o+\partial V_2/\partial I_o)\delta I_o(t)+(\partial V_1/\partial\alpha+\partial V_2/\partial\alpha)\delta\alpha(t))$ with $\partial V_1/\partial\alpha*\partial V_2/\partial\alpha<0$.

In the case of symmetry, $V_{ges}=4(V_1+\partial V_1/\partial I_o\delta I_o(t))$. This signal can be used for the automatic balancing of a bridge circuit (not shown) which compensates the mean value $<V_{o1}+V_{o2}-V_{o3}-V_{o4}>$ prior to the signal amplifier possibly present.

In the case of signal detection at the modulation frequency in quadrature phase with a weighting sequence $(+--+)$, $V_{ges}=V_{o1}-V_{o2}-V_{o3}+V_{o4}=2*(V_1-V_2+(\partial V_1/\partial I_o-\partial V_2/\partial I_o)\delta I_o(t)+(\partial V_1/\partial\alpha-\partial V_2/\partial\alpha)\delta\alpha(t))$. In the case of symmetry, $V_{ges}=4\partial V_1/\partial\alpha\delta\alpha(t)$.

The method in accordance with the invention thus enables an appropriate suppression of current distribution noise to be achieved for non-hysteretic DC SQUIDs having integrated parallel resistances (not shown).

FIG. 3 shows a sawtooth bias current $I_B$ which, at the beginning of each bias state, increases in absolute value from a value smaller than a smallest critical current $I_{o-min}$ linearly to a value larger than a largest critical current $I_{o-max}$ at the end of each bias state, is subsequently briefly switched off in order to set the SQUID to the no-voltage state again, after which each time two bias states change sign. As a result, during the subsequent alternating signal weighting in accordance with the invention, upon signal detection in the signal detection device 17 a suppression of current distribution noise can be achieved also for hysteretic DC SQUIDs without integrated parallel resistances. In FIG. 3 the four bias states are denoted by Roman numerals, the signs of the bias voltage of the flux being stated therebelow while at the lower side of FIG. 3 the signs of the signal weights are given.

The characteristics of the invention as disclosed in the above description, in the FIGS. 1, 2 and 3 and in the claims, can be of essential importance individually as well as in arbitrary combinations for carrying out the invention in its various versions.

I claim:

1. A method of suppressing current distribution noise in a DC SQUID, said SQUID for measuring the magnitude of flux, the SQUID comprising two Josephson junctions in a superconducting loop and connected to a device for producing a signal manifesting the magnitude of the flux being measured, said device comprising a control device for generating a periodic bias current having a corresponding output voltage, a modulation device for generating a flux modulation via an induced AC current in the loop, and a signal detection device for forming a mean output voltage from said output voltages, said method comprising:

reversing the polarity of the bias current ($I_B$) with the modulation frequency of the flux and with a time shift amounting to one quarter of the period duration of the modulation frequency, so that the SQUID assumes different bias states;

performing a sign weighting operation on the voltages corresponding to each bias state; and summing the output voltages thus sign weighted to produce a mean output voltage ($V_{ges}$) which is proportional to the quantity of the flux being measured.

2. A method as claimed in claim 1 including performing the flux modulation via the modulation device and a coil with $+\phi_o/4$, causing the SQUID to successively assume four bias states in a cycle, forming the means output voltage ($V_{ges}$) from the sum of the sign-weighted four output voltages of the cycle, and defining the operating points with the bias current ($I_b$) and the means flux in the SQUID.

3. A method as claimed in claim 2 including forming each output voltage of the cycle from a sum of terms, one term of the sum representing a respective corresponding voltage ($V_1$, $V_2$, $V_3$, $V_4$) at a corresponding operating point, the further terms of said sum of terms representing the measured flux quantity, the means critical current and the asymmetry of the SQUID, where $V_3 = -V_1$ and $V_4 = -V_2$, that, in the case of a symmetrical SQUID, in a simplification $V_2 = V_1$ and $\delta V_2/\delta\phi = -\delta V_1/\delta\phi$ is taken into account where $\phi$ is the flux corresponding to said output voltages.

4. A method as claimed in claim 3 including executing a signal detection by lock-in detecting with double the modulation frequency, said performing the weighting operation performing for each bias state a weighting operation which changes that bias state sign via an alternating sign weighting operation, so that the current distribution noise signals add to zero.

5. A method as claimed in claim 3 wherein the performing the weighting operation includes performing a signal detection on the modulation frequency with a successively pair-wise equal weighting sequence, using the means output voltage ($V_{ges}$) of the detection device for the automatic balancing of a bridge circuit to compensate the mean value of the mean output voltage ($V_{ges}$).

6. A method as claimed in claim 3 wherein the performing the weighting operation includes performing a signal detection on the modulation frequency in quadrature phase with a symmetrical weighting sequence.

7. A method as claimed in claim 1, including in controlling the bias current ($I_B$) for a hysteretic DC SQUID so that, in an absolute sense it increases monotonously in a first bias state for one half period, briefly switching the bias current off, monotonously increasing the bias current again in the next bias state of this half period, and varying the bias current in a mirror-image fashion during the next half period.

8. A method as claimed in claim 7, including in controlling the bias current ($I_B$) so that, in an absolute sense, it increases linearly from a current below a smallest critical current ($I_{o-min}$) to a current above a largest critical current ($I_{o-max}$).

9. A method as claimed in claim 2, including in controlling the bias current ($I_B$) for a hysteretic DC SQUID so that, in an absolute sense it increases monotonously in a first bias state for one half period, briefly switching the bias current off, monotonously increasing the bias current again in the next bias state of this half period, and varying the bias current in a mirror-image fashion during the next half period.

10. A method as claimed in claim 3, including in controlling the bias current ($I_B$) for a hysteretic DC SQUID so that, in an absolute sense it increases monotonously in a first bias state for one half period, briefly switching the bias current off, monotonously increasing the bias current again in the next bias state of this half period, and varying the bias current in a mirror-image fashion during the next half period.

11. A method as claimed in claim 4, including in controlling the bias current ($I_B$) for a hysteretic DC SQUID so that, in an absolute sense it increases monotonously in a first bias state for one half period, briefly switching the bias current off, monotonously increasing the bias current again in the next bias state of this half period, and varying the bias current in a mirror-image fashion during the next half period.

12. A method as claimed in claim 5, including in controlling the bias current ($I_B$) for a hysteretic DC SQUID so that, in an absolute sense it increases monotonously in a first bias state for one half period, briefly switching the bias current off, monotonously increasing the bias current again in the next bias state of this half period, and varying the bias current in a mirror-image fashion during the next half period.

13. A method as claimed in claim 6, including in controlling the bias current ($I_B$) for a hysteretic DC SQUID so that, in an absolute sense it increases monotonously in a first bias state for one half period, briefly switching the bias current off, monotonously increasing the bias current again in the next bias state of this half period, and varying the bias current in a mirror-image fashion during the next half period.

14. A method as claimed in claim 9, including in controlling the bias current ($I_B$) so that, in an absolute sense, it increases linearly from a current below a smallest critical current ($I_{o\text{-}min}$) to a current above the largest critical current ($I_{o\text{-}max}$).

15. A method as claimed in claim 10, including in controlling the bias current ($I_B$) so that, in an absolute sense, it increases linearly from a current below a smallest critical current ($I_{o\text{-}min}$) to a current above the largest critical current ($I_{o\text{-}max}$).

16. A method as claimed in claim 11, including in controlling the bias current ($I_B$) so that, in an absolute sense, it increases linearly from a current below a smallest critical current ($I_{o\text{-}min}$) to a current above the largest critical current ($I_{o\text{-}max}$).

17. A method as claimed in claim 12, including in controlling the bias current ($I_B$) so that, in an absolute sense, it increases linearly from a current below a smallest critical current ($I_{o\text{-}min}$) to a current above the largest critical current ($I_{o\text{-}max}$).

18. A method as claimed in claim 13, including in controlling the bias current ($I_B$) so that, in an absolute sense, it increases linearly from a current below a smallest critical current ($I_{o\text{-}min}$) to a current above the largest critical current ($I_{o\text{-}max}$).

* * * * *